Dec. 5, 1967 D. S. WILLARD 3,356,956

DECIMAL COUNTER AND LOGIC GATE CONTROLLED STEP SAWTOOTH GENERATOR

Filed June 7, 1965 2 Sheets-Sheet 1

INVENTOR.
DAVID S. WILLARD
BY Harry A. Herbert Jr. and Julian L. Siegel
ATTORNEYS Dec. 5, 1967 D. S. WILLARD 3,356,956

DECIMAL COUNTER AND LOGIC GATE CONTROLLED STEP SAWTOOTH GENERATOR

Filed June 7, 1965 2 Sheets-Sheet 2

INVENTOR.
DAVID S. WILLARD
BY Harry A. Herbert Jr.
Julian L. Siegel
ATTORNEYS 3,356,956
Patented Dec. 5, 1967

3,356,956

DECIMAL COUNTER AND LOGIC GATE CONTROLLED STEP SAWTOOTH GENERATOR

David S. Willard, High Rolls, N. Mex., assignor to the United States of America as represented by the Secretary of the Air Force Filed June 7, 1965, Ser. No. 462,149
4 Claims. (Cl. 328—181)

ABSTRACT OF THE DISCLOSURE

A step sawtooth generator controlled by decimal counter in which a logic gate circuit selects the voltage supplied to a load. A power source supplies power to a load in step sequence through a sequence of resistor and diode series combinations, the diodes passing current only when they have the proper bias as determined by the associated logic circuit which is in turn controlled by the outputs of the decimal counter.

The invention described herein may be manufactured and used by or for the United States Government for governmental purposes without payment to me of any royalty thereon.

This invention relates to an electrical signal generator, and more particularly to a step sawtooth generator.

In satellite and star observations using closed loop television techniques, a step sawtooth generator of precision steps and linearity, in place of the conventional vertical sweep, will greatly improve both the positional accuracy of the image and the precise time readout capability. Closed loop television offers an opportunity to vary the techniques of television transmission as strict requirements of television broadcasting need not be adhered to.

This invention provides a means for producing a precision step sawtooth wave which is essentially limited in accuracy only by the state of art or precision voltage regulated power supply and of precision direct current voltmeters.

It is therefore an object of this invention to provide a novel sweep generator.

It is another object to provide a sweep generator having a step sawtooth pattern.

It is still another object to provide a sweep step sawtooth generator controlled by a decimal counter.

It is yet another object to provide a method for accurately adjusting a sweep step sawtooth generator to give a precision step sawtooth pattern.

These and other advantages, features and objects of the invention will become more apparent from the following description taken in connection with the illustrative embodiments in the accompanying drawings, wherein.

Figure 1:
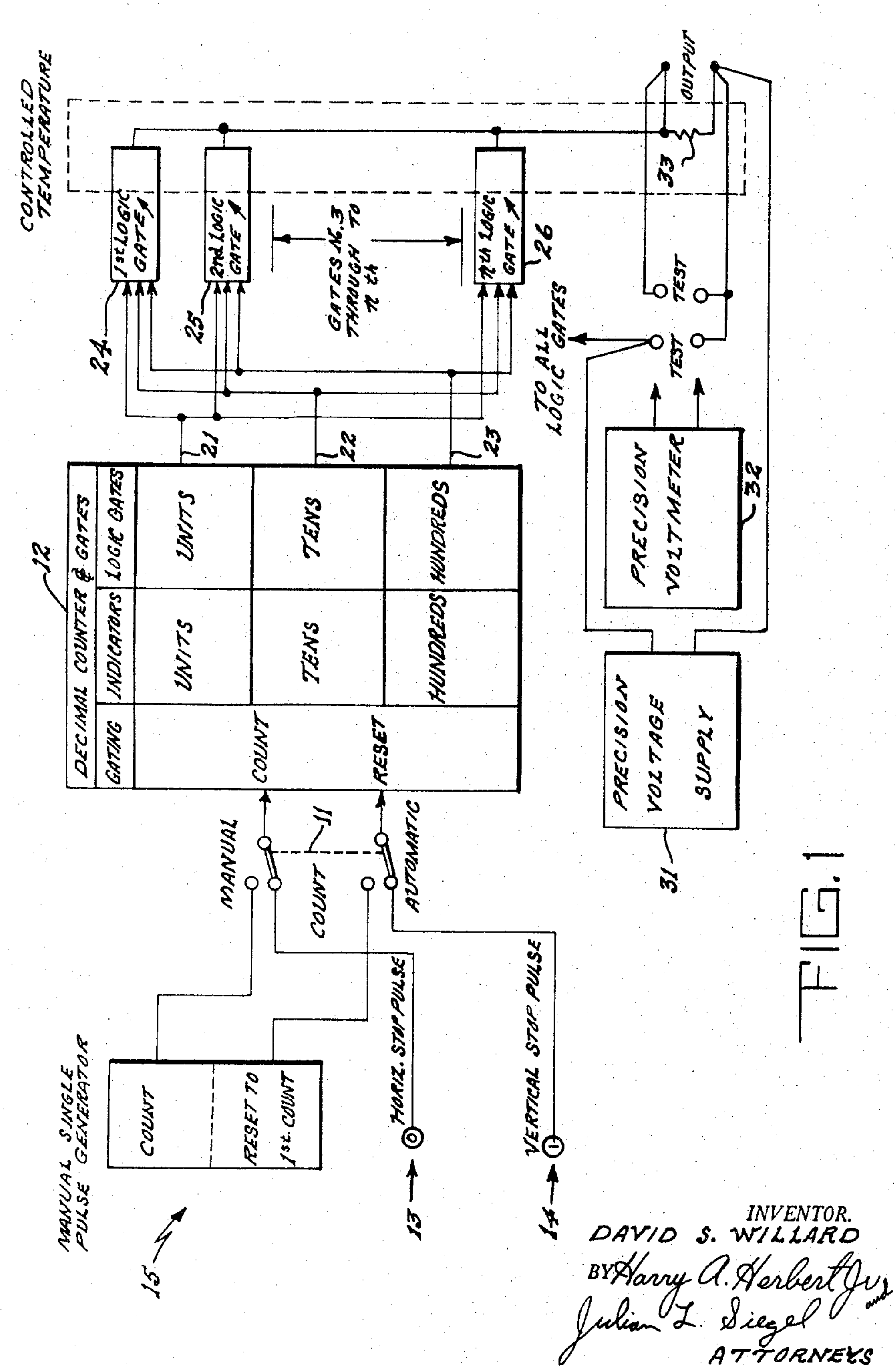
FIG. 1 is a block diagram of an embodiment of this invention.

Referring to FIG. 1, appropriate pulses are applied to control decimal counter 12 which in turn controls as many logic gates as are desired, one for each line of horizontal sweep. The pulses can be applied either manually or automatically by changing the position of switch 11. When in the automatic position, horizontal stop pulses are applied from source 13 and vertical stop pulses from source 14. When switch 11 is in the manual position, decimal counter 12 is then coupled to single pulse generator 15 which supplies pulses for counting and for resetting. Decimal counter 12 has a units output at 21, a tens output at 22, and a hundreds output at 23. Each of these digit outputs feed first logic gate 24, second logic gate 25 through *n*th logic gate 26. The progression of voltage steps is provided by logic gates in combination with the decimal counter. The specific arrangements are well known in the art, an example of which is described in Computer Basics, vol. 6, pp. 139–145, by Technical Education and Management, Inc., and published by Howard W. Sams, Inc. Precision power supply 31 is applied to all logic gates. Precision voltmeter 32 can measure the output across load resistor 33. It is desired that power supply 31 and voltmeter 32 have an .01 percent accuracy.

Figures 2, 3:
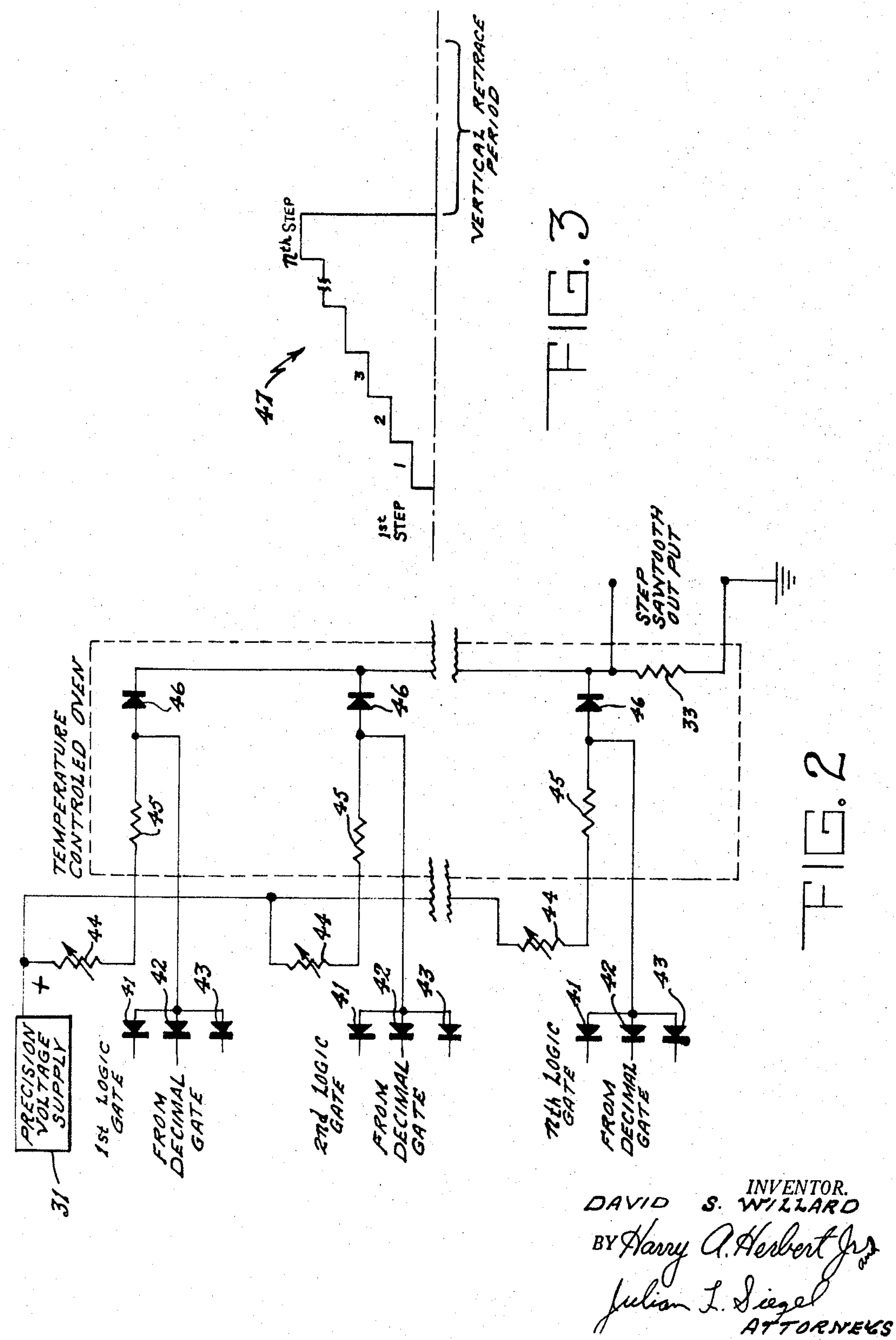
FIG. 2 is a circuit diagram showing the logic gates of the step sawtooth generator.
FIG. 3 shows the output waveform of the step sawtooth generator.

FIG. 2 shows 1st, 2nd and *n*th logic gate circuits, each of the circuits being identical in structure and operation so that the description of the 1st logic gate suffices for all. The 1st logic gate is comprised of diodes fed from decimal counter 12 of FIG. 1. Logic gate 41 has a units input; logic gate 42 has a tens input; and logic gate 43 has a hundreds input. Positive precision voltage supply 31 is supplied through variable resistor 44 and fixed resistor 45. The logic gates will provide a current conduction path through diodes 41, 42, and 43 such that no current can flow through diode 46 except for one logic combination which provides no conduction path for diodes 41, 42 or 43. Progressively, a conduction path will occur at each of the logic gates, thus progressively allowing voltage to reach resistor 33 via the various progressive series combination of diodes 46, and resistors 44 and resistors 45, the value of which is chosen to give the proper step voltages. It is desirable to have diodes 46 of the same value but any inequality can be compensated for by adjustment of variable resistors 44.

With switch 11 in the manual position and with power coming from precision voltage source 31, resistors 44 and 45 can be selected and adjusted so that each progressive step can have a precise increase in voltage of 1/total steps. This voltage can be measured with a precision voltmeter, and the proper value of variable resistor 44 can be adjusted for the exact voltage desired across output resistor 33 for that specific step. This operation allows adjustment of steps to about .01 percent accuracy. For optimum accuracy resistors 45 and diodes 46 should be kept temperature controlled. Using automatic operation with the "Vertical Stop Pulse" the decimal counter resets to the first count and then progresses another step with each "Horizontal Stop Pulse."

FIG. 3 shows the resultant waveform 47.

With this circuit, precise starting of the rise of the sawtooth waveform at the end of a blanking pulse is not necessary. At each stop pulse, the step level can go to and stabilize at its proper level during the blanking pulse.

What is claimed is:

1. In a step sawtooth generator, a decimal counter controlled logic gate circuit comprising:

(a) a plurality of diode circuits, each circuit having a first, second and third diode, in parallel arrangement, the first diode of each circuit being connected to the units output of said decimal counter, the second diode of each circuit being connected to the tens output of said decimal counter, and the third diode of each circuit being connected to the hundreds output of said decimal counter;

(b) an output load resistor;

(c) a supply voltage source connected to the diode circuits and the output load resistor for transferring various quantities of current to the output load resistor or the diode circuits dependent upon the bias of the diodes determined by decimal counter; and (d) a plurality of voltage regulating resistors, each interposed between the supply voltage source and one each of the diode circuits.

2. A logic gate circuit according to claim 1 which further comprises a plurality of load resistor diodes in parallel and each connected between the load resistor and the voltage regulating resistors.

3. A logic gate circuit according to claim 2 wherein each of the plurality of voltage regulating resistors comprises a series combination of a variable resistor for adjustment of output voltage and a fixed resistor one of each combination being connected to the power supply and the other to one of the diode circuits.

4. A logic gate circuit according to claim 3 wherein each of the fixed voltage regulating resistors and each of the load resistor diodes are enclosed in a temperature controlled oven.

References Cited

UNITED STATES PATENTS

| | | | |
|---|---|---|---|
| 2,858,434 | 10/1958 | Tollefson | 328—186 |
| 3,249,879 | 5/1966 | Ward et al. | 328—186 |

ARTHUR GAUSS, *Primary Examiner.*

S. D. MILLER, Jr., *Assistant Examiner.*